(12) United States Patent
Kumar et al.

(10) Patent No.: US 9,230,942 B2
(45) Date of Patent: Jan. 5, 2016

(54) SEMICONDUCTOR DEVICE INCLUDING ALTERNATING STEPPED SEMICONDUCTOR DIE STACKS

(71) Applicant: SANDISK INFORMATION TECHNOLOGY (SHANGHAI) CO., LTD., Shanghai (CN)

(72) Inventors: Shiv Kumar, Saharanpur (IN);
Chin-Tien Chiu, Taichung (TW);
Dacheng Huang, Shanghai (CN);
Zhong Lu, Shanghai (CN); Zhongli Ji, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/422,179

(22) PCT Filed: Feb. 26, 2013

(86) PCT No.: PCT/CN2013/071881
§ 371 (c)(1),
(2) Date: Feb. 17, 2015

(87) PCT Pub. No.: WO2014/131152
PCT Pub. Date: Sep. 4, 2014

(65) Prior Publication Data
US 2015/0228621 A1 Aug. 13, 2015

(51) Int. Cl.
*H01L 23/48* (2006.01)
*H01L 21/00* (2006.01)
(Continued)

(52) U.S. Cl.
CPC ........ *H01L 25/0657* (2013.01); *H01L 23/3107* (2013.01); *H01L 24/49* (2013.01); *H01L 24/83* (2013.01); *H01L 24/85* (2013.01); *H01L 24/92* (2013.01); *H01L 24/95* (2013.01);
(Continued)

(58) Field of Classification Search
CPC .................. H01L 25/0657; H01L 2224/48091; H01L 25/0756; H01L 25/50; H01L 24/42; H01L 24/46; H01L 24/85; H01L 24/92; H01L 23/3107; H01L 2224/46; H01L 2224/48227; H01L 2224/48147; H01L 2225/06503; H01L 2225/06562; H01L 2225/06506; H01L 2924/10
USPC ........... 257/777, E25.006, E25.013, E25.021, 257/E25.027, E23.085; 438/109
See application file for complete search history.

(56) References Cited

U.S. PATENT DOCUMENTS 7,791,191 B2   9/2010  Takiar et al.
8,390,114 B2 *  3/2013  Kim et al. .................... 257/724

(Continued)

FOREIGN PATENT DOCUMENTS

| CN | 102347317 | 2/2012 |
| JP | 2009158739 | 7/2009 |
| TW | 201119007 | 6/2011 |

OTHER PUBLICATIONS

International Search Report and Written Opinion dated Nov. 28, 2013 in International Patent Application No. PCT/CN2013/071881.

(Continued)

*Primary Examiner* — Jasmine Clark
(74) *Attorney, Agent, or Firm* — Vierra Magen Marcus LLP (57) ABSTRACT

A semiconductor device including alternating stepped semiconductor die stacks to allow for large numbers of semiconductor die to be provided within a semiconductor device using short wire bonds.

20 Claims, 7 Drawing Sheets

(51) Int. Cl.
*H01L 25/065* (2006.01)
*H01L 23/31* (2006.01)
*H01L 25/00* (2006.01)
*H01L 23/00* (2006.01)
*H01L 23/498* (2006.01)

(52) U.S. Cl.
CPC .......... *H01L 25/50* (2013.01); *H01L 23/49816* (2013.01); *H01L 23/49827* (2013.01); *H01L 24/29* (2013.01); *H01L 24/32* (2013.01); *H01L 24/45* (2013.01); *H01L 2224/2919* (2013.01); *H01L 2224/2929* (2013.01); *H01L 2224/32145* (2013.01); *H01L 2224/32225* (2013.01); *H01L 2224/45139* (2013.01); *H01L 2224/45144* (2013.01); *H01L 2224/48091* (2013.01); *H01L 2224/48145* (2013.01); *H01L 2224/48147* (2013.01); *H01L 2224/48227* (2013.01); *H01L 2224/49175* (2013.01); *H01L 2224/49429* (2013.01); *H01L 2224/78301* (2013.01); *H01L 2224/8314* (2013.01); *H01L 2224/83856* (2013.01); *H01L 2224/85045* (2013.01); *H01L 2224/85205* (2013.01); *H01L 2224/85207* (2013.01); *H01L 2224/9222* (2013.01); *H01L 2225/0651* (2013.01); *H01L 2225/06506* (2013.01); *H01L 2225/06562* (2013.01); *H01L 2225/06572* (2013.01); *H01L 2924/1438* (2013.01); *H01L 2924/181* (2013.01)

(56) References Cited

U.S. PATENT DOCUMENTS

| | | |
|---|---|---|
| 2005/0029645 A1 | 2/2005 | Mess et al. |
| 2008/0150158 A1 | 6/2008 | Chin |
| 2009/0085223 A1 | 4/2009 | Nishiyama et al. |
| 2009/0166829 A1 | 7/2009 | Nishiyama et al. |
| 2010/0117241 A1 | 5/2010 | Denda |
| 2010/0200976 A1 | 8/2010 | Nishiyama et al. |
| 2011/0062581 A1 | 3/2011 | Kim et al. |

OTHER PUBLICATIONS

Response to Office Action filed Aug. 24, 2015 in Taiwan Patent Application No. 102149298.

Office Action dated May 21, 2015 in Taiwan Patent Application No. 102149298.

* cited by examiner

Fig. 12

SEMICONDUCTOR DEVICE INCLUDING ALTERNATING STEPPED SEMICONDUCTOR DIE STACKS

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

Figure 1:
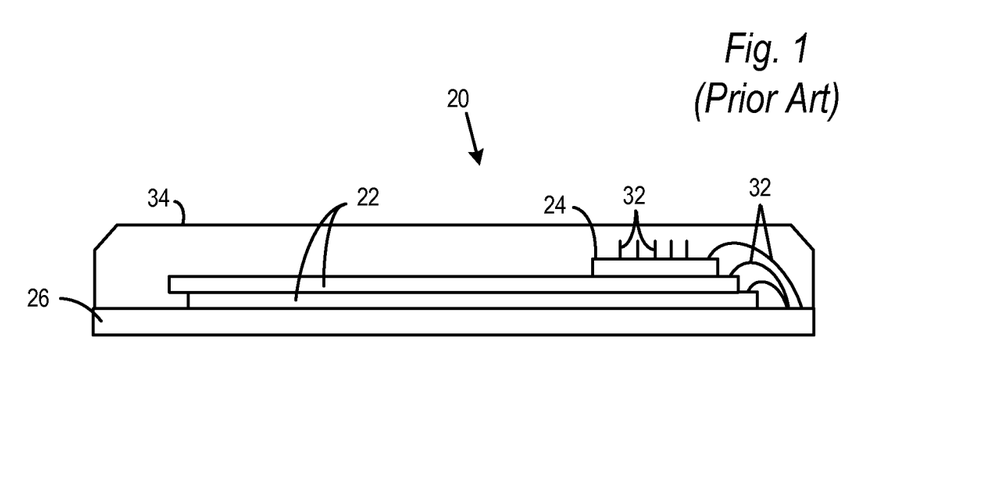
FIG. 1 is a cross-sectional side view of a conventional semiconductor package.
Figure 2:
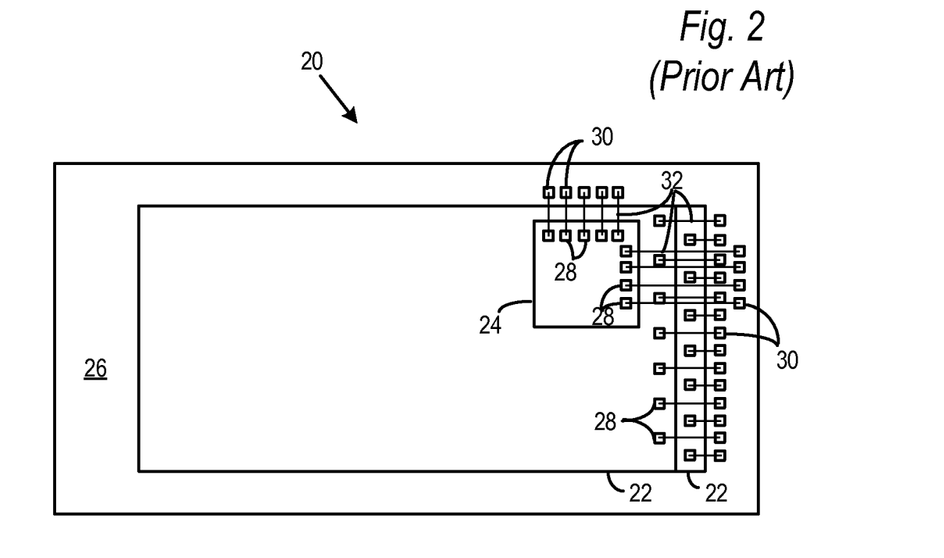
FIG. 2 is a top view of a conventional substrate and wire bonded semiconductor die.

A cross-sectional side view and a top view of a conventional semiconductor package 20 are shown in FIGS. 1 and 2 (without molding compound in FIG. 2). Typical packages include a plurality of semiconductor dies, such as flash memory die 22 and controller die 24, affixed to a substrate 26. A plurality of die bond pads 28 may be formed on the semiconductor dies 22, 24 during the die fabrication process. Similarly, a plurality of contact pads 30 may be formed on the substrate 26. Die 22 may be affixed to the substrate 26, and then die 24 may be mounted on die 22. All dies may then be electrically coupled to the substrate by affixing wire bonds 32 between respective die bond pad 28 and contact pad 30 pairs. Once all electrical connections are made, the dies and wire bonds may be encapsulated in a molding compound 34 to seal the package and protect the dies and wire bonds.

In order to most efficiently use package footprint, it is known to stack semiconductor die on top of each other, either completely overlapping each other with a spacer layer in between adjacent dies, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack.

As semiconductor die become thinner, and in order to increase memory capacity in semiconductor packages, the number of dies stacked within a semiconductor package continues to increase. However, this can make for long bonds wire from the upper die down to the substrate. Long bonds wire are easily damaged or shorted to other wire bonds, and also have higher signal to noise ratio than shorter bond wires.

DETAILED DESCRIPTION

The present technology will now be described with reference to FIGS. 3 through 12, which in embodiments, relate to a semiconductor device including alternating stepped semiconductor die stacks to allow for large numbers of semiconductor dies to be provided within a semiconductor device using short wire bonds. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present invention will now be explained with reference to the flowchart of FIG. 3 and the top and side views of FIGS. 4 through 12. Although FIGS. 4 through 12 each show an individual device 100, or a portion thereof, it is understood that the device 100 may be batch processed along with a plurality of other packages 100 on a substrate panel to achieve economies of scale. The number of rows and columns of packages 100 on the substrate panel may vary.

Figure 4:
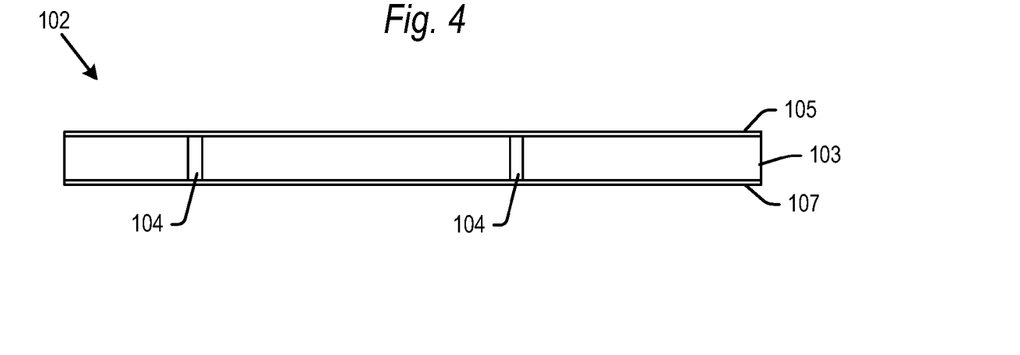
FIG. 4 is a side view of a semiconductor device at a first step in the fabrication process according to an embodiment of the present technology.
Figure 5:
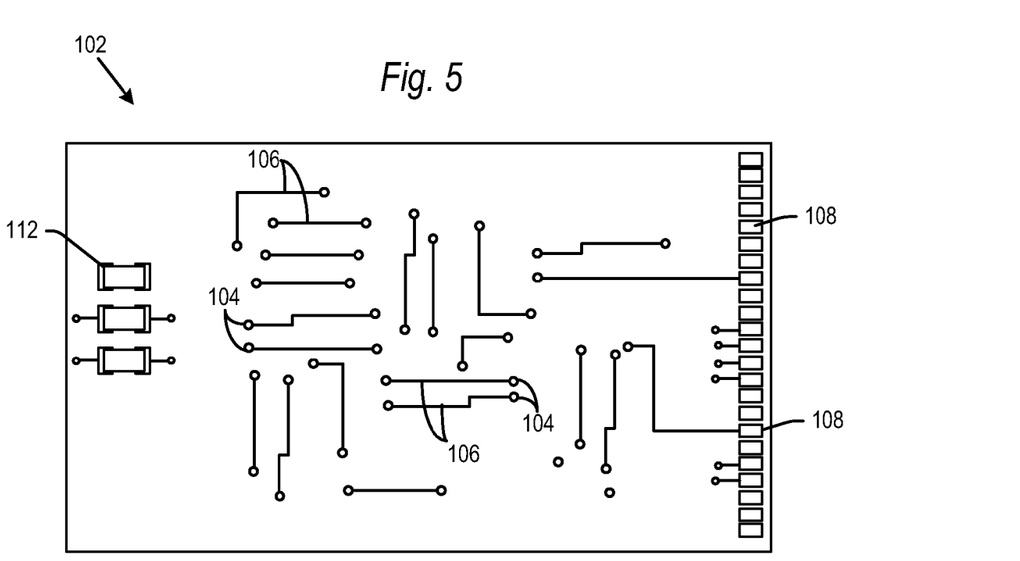
FIG. 5 is a top view of a semiconductor device at a second step in the fabrication process according to an embodiment of the present technology.
Figure 6:
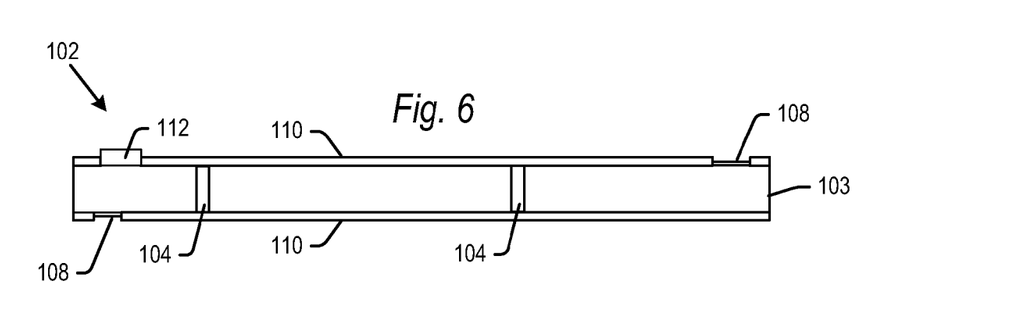
FIG. 6 is a side view of a semiconductor device at a third step in the fabrication process according to an embodiment of the present technology.

The substrate panel begins with a plurality of substrates 102 (again, one such substrate is shown in FIGS. 4 through 12). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as indicated in FIG. 4. The core 103 may be formed of various dielectric materials such as for example, polyimide laminates, epoxy resins including FR4 and FR5, bismaleimidetriazine (BT), and the like. Although not critical to the present invention, the core may have a thickness of between 40 microns (µm) to 200 µm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 µm to 25 µm, although the thickness of the layers may vary outside of that range in alternative embodiments.

Figure 3:
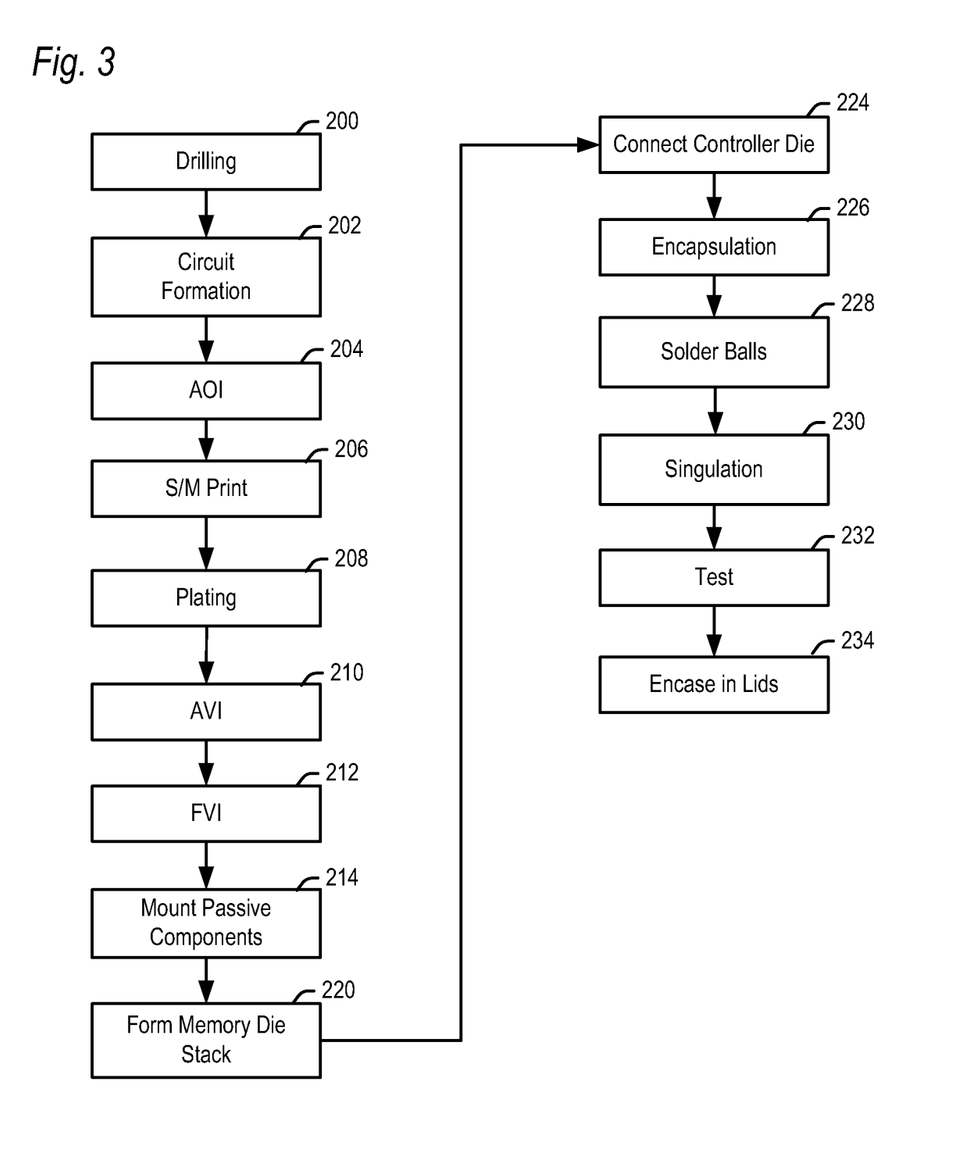
FIG. 3 is a flowchart of the overall fabrication process of semiconductor device according to embodiments of the present invention.

FIG. 3 is a flowchart of the fabrication process for forming a semiconductor device according to embodiments of the present invention. In a step 200, the substrate 102 may be drilled to define through-hole vias 104 in the substrate 102. The vias 104 (only some of which are numbered in the figures) are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106 and contact pads 108 as shown for example in FIGS. 5 and 6. The traces 106 and contact pads 108 (only some of which are numbered in the figures) are by way of example, and the substrate 102 may include more traces and/or contact pads than is shown in the figures, and they may be in different locations than is shown in the figures.

In embodiments, the finished semiconductor device 100 assembly may be used as a BGA (ball grid array) package. A lower surface of the substrate 102 may include contact pads 108 for receiving solder balls as explained below. In further embodiments, the finished semiconductor device 100 may be a LGA (land grid array) package including contact fingers for removably coupling the finished device 100 within a host device. In such embodiments, the lower surface may include contact fingers instead of the contact pads that receive solder balls. The conductance pattern on the top and/or bottom surfaces of the substrate 102 may be formed by a variety of known processes, including for example various photolithographic processes.

Referring again to FIG. 3, the substrate 102 may then be inspected in an automatic optical inspection (AOI) in step 204. Once inspected, a solder mask 110 may be applied to the substrate in step 206. After the solder mask is applied, the contact pads, contact fingers and any other solder areas on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches and discoloration.

Assuming the substrate 102 passes inspection, passive components 112 may next be affixed to the substrate in a step 214. The one or more passive components may include for example one or more capacitors, resistors and/or inductors, though other components are contemplated. The passive components 112 (only some of which are numbered in the figures) shown are by way of example only, and the number, type and position may vary in further embodiments.

Figure 7:
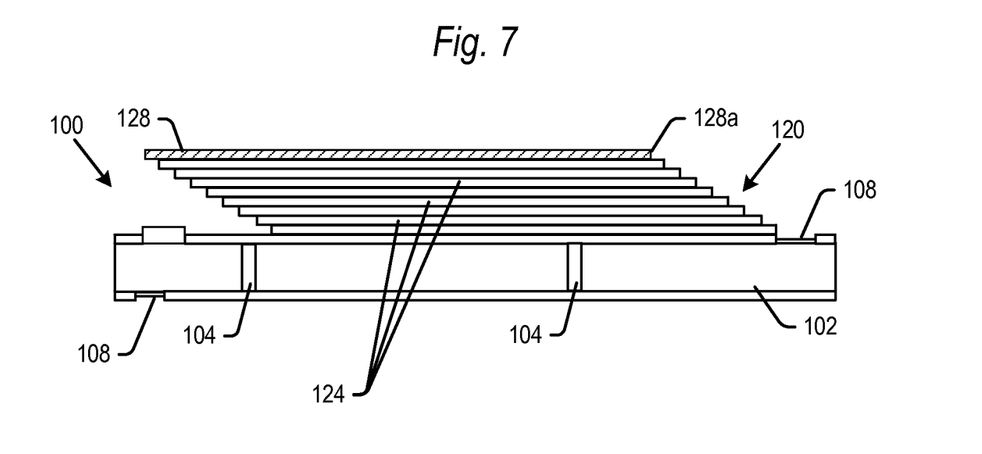
FIG. 7 is a side view of a semiconductor device at a fourth step in the fabrication process according to an embodiment of the present technology.

In accordance with the present technology, a number of semiconductor die stacks may next be formed on the substrate 102 in step 220. As explained below, each die stack may be stepped in opposite directions, with a transition between adjacent die stacks accomplished with an interposer layer between the adjacent die stacks. Referring to FIG. 7, a number of semiconductor die 124 may be stacked atop each other in an offset stepped configuration to form a first die stack 120. The die may be affixed to the substrate and/or each other using a die attach film. As one example, the die attach adhesive may be 8988UV epoxy from Henkel AG & Co. KGaA, cured to a B-stage to preliminarily affix the die 124 in the stack 120, and subsequently cured to a final C-stage to permanently affix the die 124 in the stack 120.

The semiconductor die 124 may for example be memory die such a NAND flash memory die, but other types of die 124 may be used. FIG. 7 shows an embodiment where eight dies 124 are mounted in stack 120. However, there may be more or less than eight dies 124 in stack 120 in further embodiments.

After the die stack 120 is formed, an interposer layer 128 may be affixed to the upper die 124 in the stack 120 as shown in FIG. 7. The interposer layer 128 may be offset in the same way and to the same extent as the other die 124 in stack 120. Interposer layer 128 may be a rigid layer, formed for example of FR4 and FR5, or a flexible layer, formed for example of polyimide tape. A conductance pattern is formed on an upper surface of the interposer layer. As explained below, the conductance pattern and interposer layer are provided for the purpose of transferring signals from contact pads on one side of the interposer layer 128 to corresponding contact pads on the opposite side of the interposer layer.

Figure 8:
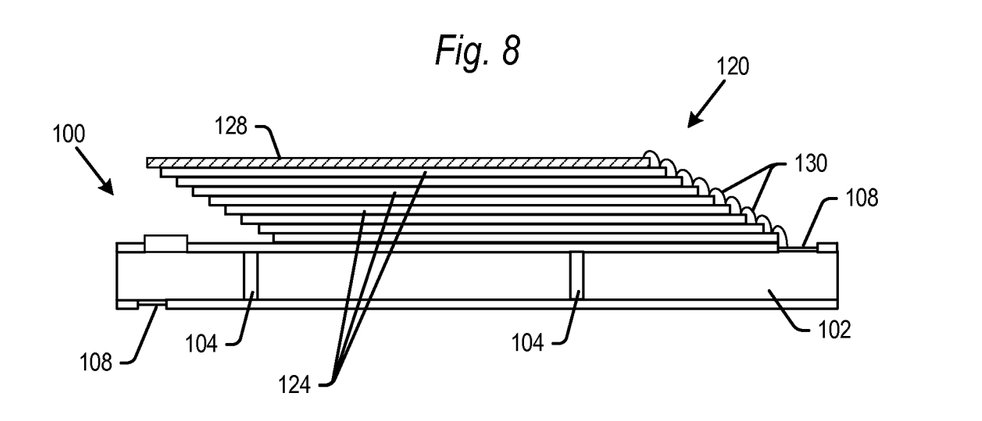
FIG. 8 is a side view of a semiconductor device at a fifth step in the fabrication process according to an embodiment of the present technology.
Figure 9:
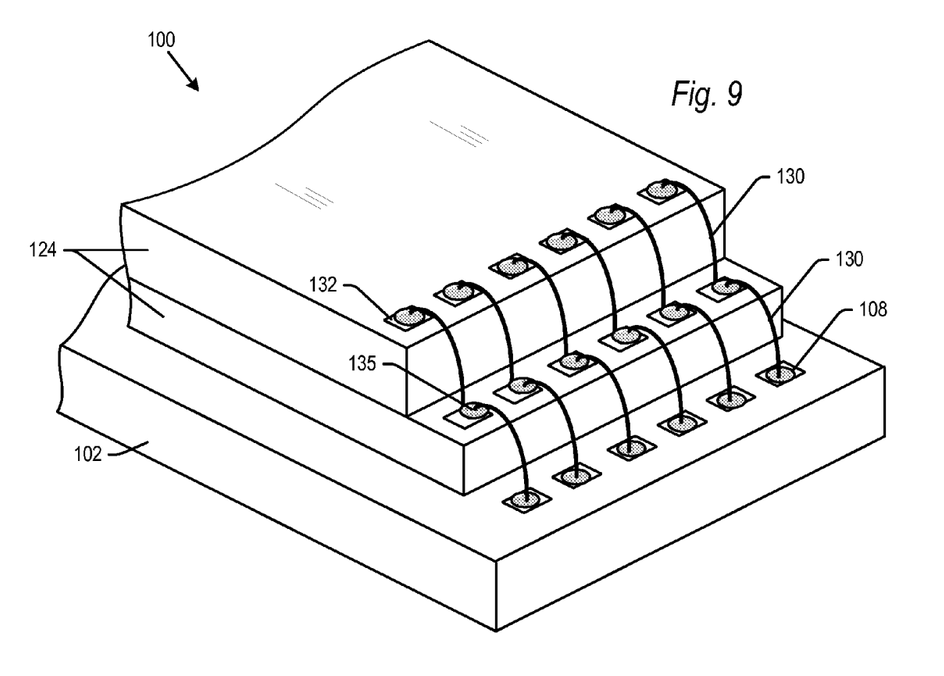
FIG. 9 is a simplified perspective view of a semiconductor device at the fifth step in the fabrication process according to an embodiment of the present technology.

Referring now to side view of FIG. 8, once the die stack 120 is formed, the respective die 124 in the stack 120 may be electrically connected to the substrate using wire bonds 130 each of the die in the stack to the substrate 102. FIG. 9 is a simplified perspective view showing the substrate 102 and only the bottom two dies 124 in die stack 120. As shown, each semiconductor die 124 may include a row of die bond pads 132 along an edge of the die 124. It is understood that each die 124 may include many more die bond pads 132 than is shown in FIG. 9. Each die bond pad 132 in the row of a semiconductor die may be electrically connected to the corresponding die bond pad 132 in the row of the next adjacent semiconductor die using a wire bond 130. Each die bond pad 132 of the bottom semiconductor die 124 may be electrically connected to the corresponding contact pad 108 in the row of contact pads on substrate 102 using a wire bond 130.

Although wire bonds 130 may be formed by a variety of technologies, in one embodiment, the wire bonds 130 may be formed as reverse ball bonds. These may be fashioned by first depositing a ball bond 135 on die bond pads of a die, such as bottom die 124, using a wire bonding capillary of known construction (not shown). The ball bonds 135 (one of which is numbered in FIG. 9) may be formed by feeding a length of wire (typically gold or silver alloy) through a central cavity of the wire bonding capillary. The wire protrudes through a tip of the capillary, where a high-voltage electric charge is applied to the wire from a transducer associated with the capillary tip. The electric charge melts the wire at the tip and the wire forms into a ball 135 owing to the surface tension of the molten metal. The ball 135 may then be affixed to a die bond pad 132 under a load, while the transducer applies ultrasonic energy.

The wire bonding capillary may then pay out a small length of wire, and the wire may be severed at the conductive ball to leave the ball bond 135 on the die bond pad 132. The small tail of wire hanging from the end of the capillary may then be used to form the ball bond 135 for the next subsequent die bond pad 132 in the row. Ball bonds 135 may be formed at the bond pads of semiconductor die 124 by a variety of other methods including for example stud bumping or gold bumping at the wafer level, or by a variety of other methods.

Thereafter, another ball bond is formed on the next lower level (for example on substrate 102) as explained above. However, instead of severing the wire, the wire is payed out and brought into contact with a corresponding ball bond 135 on the next higher level (though one or more levels may be skipped in further embodiments). The wire is applied to the ball bond 135 under a load, while the transducer applies ultrasonic energy. The combined heat, pressure, and ultrasonic energy create a bond between the wire and ball bond 135. The wire bonding capillary may then pay out a small length of wire, and the wire may be severed to form the wire bond 130 between corresponding pads on different levels.

This process may be repeated, both horizontally across the pads on the die and substrate, and vertically between the pads on the die and substrate, until all wire bonds 130 have been formed. The order with which wire bonds 130 are formed (horizontally or vertically) may vary in different embodiments. Moreover, while the wire bonds 130 are shown generally in a straight vertical column from one layer to the next in the die stack 120 and substrate, one or more of the wire bonds may extend diagonally from one layer to the next. Further, it may be that a wire bond skips one or more layers in the die stack 120.

As noted above, an interposer layer 128 may be affixed atop a die stack 120. The interposer layer may include a first edge 128a (FIG. 7) having a row of contact pads corresponding in number and position to the row of die bond pads 132 on the die 124 in the die stack 120 below the interposer layer 128. Wire bonds 130 may be formed between the row of contact pads on the edge 128a of interposer layer 128 and the below-adjacent die 124 (the die at the top of the die stack 120) in the same manner as the wire bonds 130 described above.

Wire-bonding to the interposer layer 128 in this manner has advantages over conventional systems. First, no separate process or separate tool is needed to wire bond to the interposer layer 128. The wire bonding to the interposer layer 128 is the same as for the wire bonding of the die 124 below the interposer layer. Moreover, as the wire bonds are formed onto contact pads a top surface of the interposer layer 128, the contact pads are visible and wire bonds may be formed onto the visible contact pads, and visually verified, more easily than, for example, designs which attempt to bond to a lower surface of the interposer layer which may not be visible or easily accessible.

Figure 10:
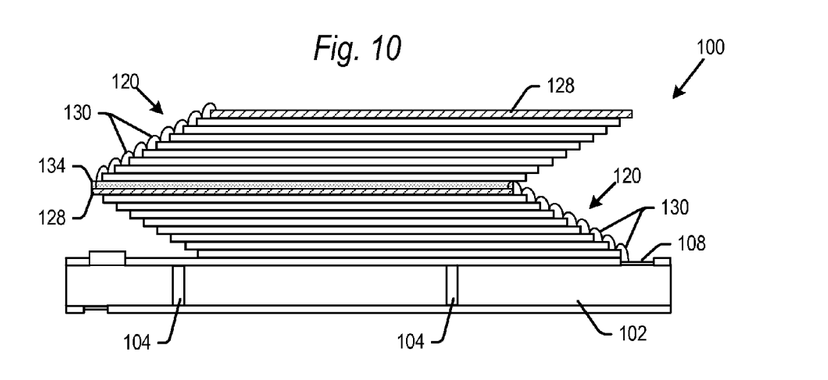
FIG. 10 is a side view of a semiconductor device at a sixth step in the fabrication process according to an embodiment of the present technology.

Referring now to the side view of FIG. 10, a second die stack 120 may next be affixed on top of the interposer layer 128 and first die stack 120. As noted, the uppermost die in the first stack 120 wire bonds onto the top surface of the interposer layer 128. In order not to damage those wire bonds, a film layer 134 is provided on an upper surface of the interposer layer 128. The wire bonds 130 onto the interposer layer 128 is embedded within the film layer 134, and the film layer 134 spaces the second die stack 120 from the interposer layer 128. The film layer 134 may for example be an electrically insulative adhesive epoxy of known composition available for example from Nitto Denko Corp. of Japan or Henkel Corporation, California.

The film layer 134 may be applied as a viscous liquid, which remains in that state until cured in a reflow process explained hereinafter. In embodiments, the film layer 134 is applied as a liquid, but has a sufficiently high viscosity to mechanically support the second die stack. In embodiments, the viscosity may be for example about $1$-$2 \times 10^6$ centipoise, but it is understood that the viscosity may be higher or lower than that in alternative embodiments. In an alternative embodiment, spacer balls may be provided within the film layer 134. The spacer balls may be polymeric spheres that act as spacers between the second die stack and interposer layer. Such spacer balls are known in the art, and are disclosed for example in U.S. Pat. No. 6,650,019, entitled, "Method of Making a Semiconductor Package Including Stacked Semiconductor Die," which patent is incorporated herein by reference in its entirety. The film layer 134 may have a thickness so that the wire bonds 130 to the interposer layer 128 embed therein, and the bottom die of the second die stack 120 does not contact the embedded wire bonds 130.

Once the film layer 134 is applied to interposer layer 128, the second die stack 120 may be affixed on top of the first die stack 120 and wire bonded to the substrate. In particular, the interposer layer 128 includes a second row of contact pads on a second edge of the interposer layer opposite the first edge. The conductance pattern on the interposer layer 128 electrically connects contact pads on the first edge of the interposer layer with corresponding contact pads on the second edge of the interposer layer.

Wire bonds 130 are formed from the contact pads on the second edge of the interposer layer 128 and the bottommost die 124 in the second die stack 120. In this way, die bond pads 132 from the bottommost die in the second die stack are electrically coupled via electrical traces in the interposer layer 128 to their corresponding die bond pads 132 on the uppermost die in the first die stack. As such, the die 124 in the second die stack are electrically coupled to the substrate 102 using only short (e.g., single jump) wire bonds 130.

Figure 10A:
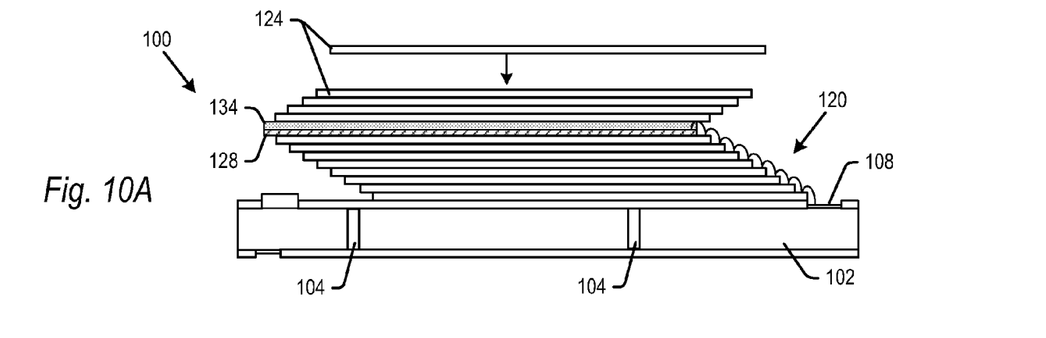
FIGS. 10A-10C are side views according to various embodiments for accomplishing the sixth step in the fabrication process shown in FIG. 9.

The die 124 in the second die stack 120 may be stepped in the same manner and to the same degree as the die 124 in the first die stack, but in the opposite direction so as to minimize the footprint of the first and second die stacks 120 together. The second die stack can be formed on top of the interposer layer 128 in a number of ways. In one example shown in FIG. 10A, the second die stack 120 may be formed in the same manner as the first die stack 120. Each die 124 may be added to the device 100 in an offset stepped configuration. Once all die in the second die stack 120 have been affixed in the stack, the die 124 may be wire bonded to each other and the substrate 102 as described above.

Figure 10B:
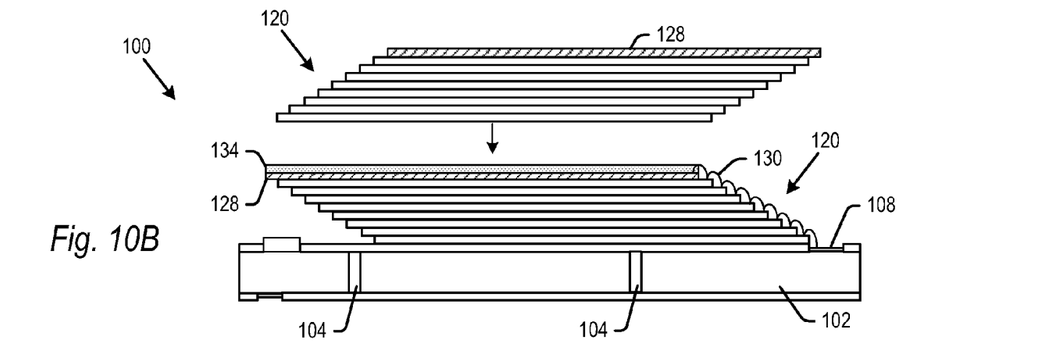

In a second example shown in FIG. 10B, the die 124 and the second die stack 120 may be assembled to each other remote from the device 100 and not part of the critical path of assembly of the device 100. The second die stack 120 may be assembled and ready to be affixed as a single preassembled stack onto the interposer layer 128 and film layer 134 as described above. Once the second die stack 120 has been affixed in the stack, the die 124 in the second die stack 120 may be wire bonded to each other and the substrate 102 as described above.

Figure 10C:
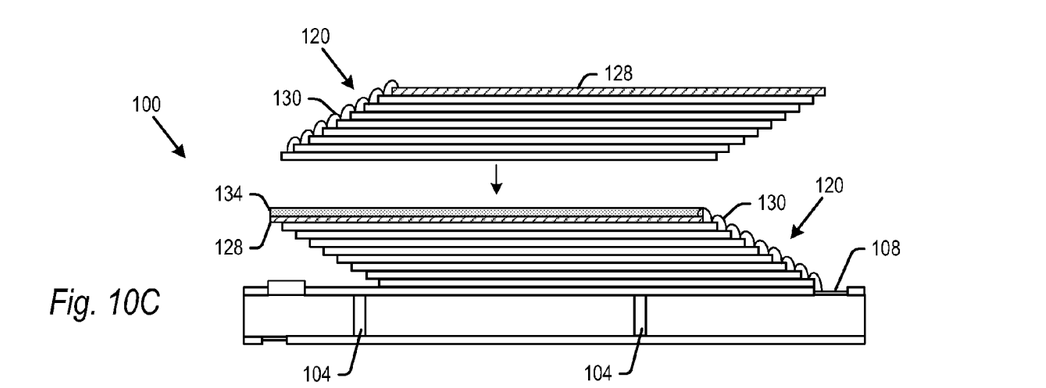

A third example shown in FIG. 10C may have a preassembled die stack 120 as in FIG. 10B, but in the example of FIG. 10C, the die 124 in the second die stack 120 may also be wire bonded to each other remote from the device 100 and not part of the critical path of assembly of the device 100. In this example, the only wire bonds that are required at the device 100 connect the die bond pads of the bottommost die 124 in the second die stack to the interposer layer 128.

Figure 11:
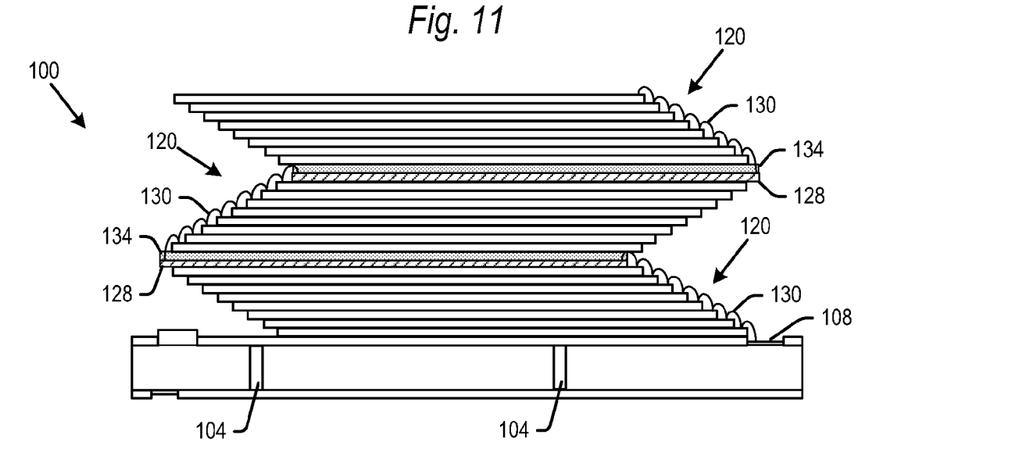
FIG. 11 is a side view of a semiconductor device at a seventh step in the fabrication process according to an embodiment of the present technology.
Figure 12:
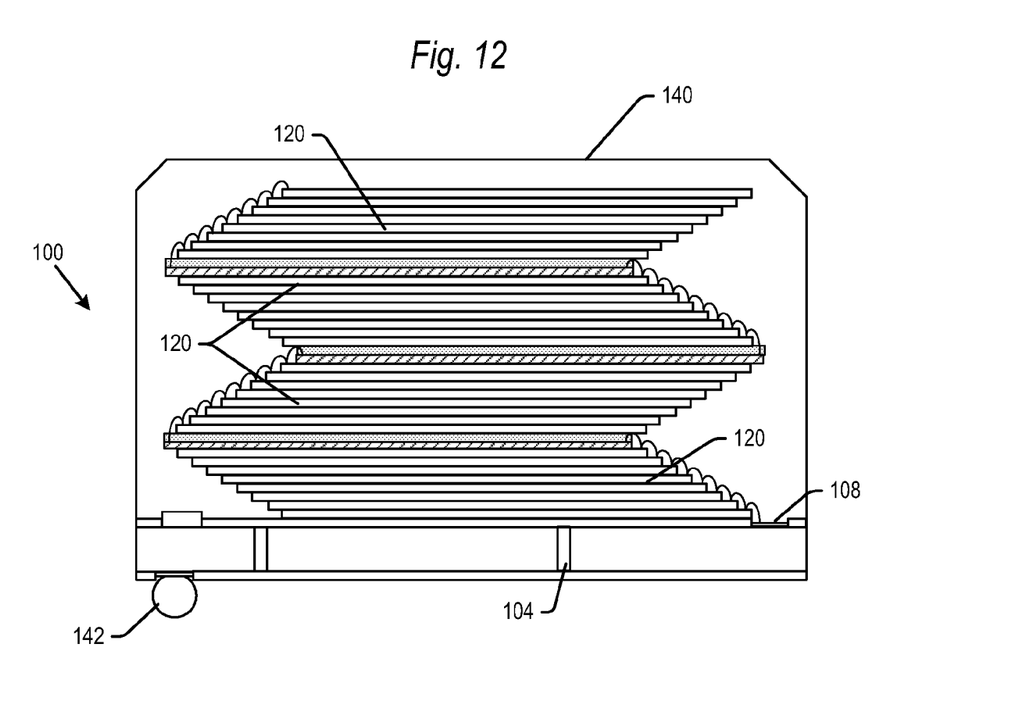
FIG. 12 is a side view of a semiconductor device at an eighth step in the fabrication process according to an embodiment of the present technology.

Referring now to the side view of FIG. 11, additional die stacks 120 may be added to the device 100 in the same manner as the second die stack 120 was added to the first die stack. Each die stack may be stepped in the opposite direction than the die stack beneath it to minimize the footprint of all die stacks together. FIG. 11 illustrates an example including three die stacks for a total of 24 die. FIG. 12 illustrates an example of four die stacks for a total of 32 dies. The illustrated devices 100 by way of example only, have more or less die stacks 120, each including more or less dies 124 according to the present technology. As one further example, there may be eight die stacks 120, each including eight die 124, for a total of 64 die in the device 100.

Where an additional die stack 120 is to be added to the device 100, the die stack 120 below may include an interposer layer 128 and a film layer 134, and the wire bonds may be formed as described above. The uppermost die stack 120 in the device 100 need not include an interposer layer 128 or film layer 134.

After mounting of the die stacks 120 on the substrate 102, a controller die (not shown) may be mounted and wire bonded to the substrate in step 224. In embodiments, the controller die may be mounted on the uppermost die stack 120. In further embodiments, the controller die may be mounted beneath the lowermost die stack 120. For example, the controller die may be mounted on top of the substrate 102. An example of such an embodiment is disclosed in Patent Cooperation Treaty Patent Application No. PCT/CN2013/070264, entitled "Semiconductor Device Including an Independent Film Layer For Embedding and/or Spacing Semiconductor Die," with an international filing date of Jan. 9, 2013. As a further example, the controller die may be mounted within the substrate 102. An example of such an embodiment is disclosed in Patent Cooperation Treaty Patent Application No. PCT/CN2013/071051, entitled "Semiconductor Device Including an Embedded Controller Die and Method of Making Same," with an international filing date of Jan. 28, 2013. Both of these international patent applications are incorporated by reference herein in their entirety.

Following mounting and electrical connection of the die stack and controller die, the die stacks, wire bonds and at least a portion of the substrate may be encapsulated in a mold compound 140 in a step 226 and as shown in FIG. 12. Mold compound 140 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. The encapsulation process may be performed by FFT (Flow Free Thin) compression molding in further embodiments.

The curable B-stage adhesives, such as for example the die attach film and film layer 134 may be cured to final cross-linked C-stage during the encapsulation step. The adhesives may be cured to the C-stage in a separate heating step in further embodiments.

As shown in FIG. 12, after the die on the panel are encapsulated in step 226, solder balls 142 may be soldered to the contact pads 108 on a bottom surface of the respective packages in step 228 for embodiments where the device is a BGA package. Where the packages are LGA packages, step 226 may be skipped.

The respective packages may be singulated in step 230 from the panel to form the finished semiconductor device 100 shown in FIG. 12. Each semiconductor device 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor device 100, it is understood that semiconductor device 100 may have shapes other than rectangular and square in further embodiments of the present invention.

Once cut into packages 100, the packages may be tested in a step 232 to determine whether the packages are functioning properly. As is known in the art, such testing may include electrical testing, burn in and other tests. Optionally, in step 234, the finished semiconductor devices may be encased within a lid (not shown), for example where the semiconductor devices are LGA packages.

The finished semiconductor package 100 may for example be a memory card such as for example a MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like.

In summary, in one example, the present technology relates to a semiconductor device, comprising: a substrate; a first die stack having a first semiconductor die mounted to the substrate and a second semiconductor die at an end of the first die stack opposite the first semiconductor die, the first die stack offset stepped in a first direction; an interposer layer having a first surface affixed to the second semiconductor die and a second surface opposite the first surface; a second die stack having a third semiconductor die mounted adjacent the second surface of the interposer layer and a fourth semiconductor die at an end of the second die stack opposite the third semiconductor die, the second die stack offset stepped in a second direction opposite the first direction; and wire bonds between: i) contact pads on the substrate and die bond pads of the first semiconductor die, ii) die bond pads of the second semiconductor die and contact pads on the second surface of the interposer layer, and iii) contact pads on the second surface of the interposer layer and the third semiconductor die.

In another example, the present technology relates to a semiconductor device, comprising: a substrate; a first die stack having a first semiconductor die mounted to the substrate and a second semiconductor die at an end of the first die stack opposite the first semiconductor die, the first die stack offset stepped in a first direction; an interposer layer having first and second edges, a first set of contact pads along the first edge, a second set of contact pads along the second edge, and electrical traces connecting corresponding contact pads from the first and second sets together, the interposer layer further including first and second surfaces, the first surface affixed to the second semiconductor die; a second die stack having a third semiconductor die mounted adjacent the second surface of the interposer layer and a fourth semiconductor die at an end of the second die stack opposite the third semiconductor die, the second die stack offset stepped in a second direction opposite the first direction; and wire bonds connecting a die bond pad on the fourth semiconductor die with the substrate via a path comprising: i) die bond pads on any semiconductor die in the second stack between the third and fourth semiconductor die, ii) a die bond pad on the third semiconductor die a contact pad of the second set of contact pads on the interposer layer, iii) a contact pad of the first set of contact pads on the interposer layer and a die bond pad on the second semiconductor die, iv) die bond pads on any semiconductor die in the first stack between the first and second semiconductor die, and v) a die bond pad on the first semiconductor die and a contact pad on the substrate.

In a further example, the present technology relates to a method of forming a semiconductor device, comprising: (a) forming a substrate; (b) mounting a first die stack to the substrate in an offset configuration stepped in a first direction, the first die stack having a first semiconductor die adjacent the substrate and a second semiconductor die at an end of the first die stack opposite the first semiconductor die; (c) affixing an interposer layer to the second semiconductor die, the interposer having a first surface affixed to the second semiconductor die and a second surface opposite the first surface; (d) mounting a second die stack adjacent the interposer layer in an offset configuration stepped in a second direction opposite the first direction, the second die stack having a third semiconductor die mounted adjacent the second surface of the interposer layer and a fourth semiconductor die at an end of the second die stack opposite the third semiconductor die; and (e) wire the first and second die stacks to the substrate, said step (e) comprising the step of forming a wire bond from a die bond pad of the second semiconductor die to a first contact pad on the second surface of the interposer layer in the same process that wire bonds are formed between die bond pads of the second semiconductor die and other semiconductor die in the first die stack.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a substrate;
   a first die stack having a first semiconductor die mounted to the substrate and a second semiconductor die at an end of the first die stack opposite the first semiconductor die, the first die stack offset stepped in a first direction;
   an interposer layer having a first surface affixed to the second semiconductor die and a second surface opposite the first surface;
   a film layer affixed to the second surface of the interposer layer;
   a second die stack having a third semiconductor die mounted on the film layer adjacent the second surface of the interposer layer and a fourth semiconductor die at an end of the second die stack opposite the third semiconductor die, the second die stack offset stepped in a second direction opposite the first direction; and
   wire bonds between: i) contact pads on the substrate and die bond pads of the first semiconductor die, ii) die bond pads of the second semiconductor die and contact pads on the second surface of the interposer layer, and iii) contact pads on the second surface of the interposer layer and the third semiconductor die, the wire bonds between the die bond pads of the second semiconductor die and contact pads on the second surface of the interposer layer at least partially buried in the film layer.

2. The semiconductor device of claim 1, wherein the interposer layer includes first and second edges separated by the first and second surfaces, the wire bonds between the die bond pads of the second semiconductor die and contact pads on the second surface of the interposer layer being along the first edge of the interposer layer.

3. The semiconductor device of claim 2, the wire bonds between the contact pads on the second surface of the interposer layer and the third semiconductor die being along the second edge of the interposer layer.

4. The semiconductor device of claim 1, wherein the first and second die stacks include flash memory die.

5. The semiconductor device of claim 1, wherein the first and second die stacks each include four to eight memory dies.

6. The semiconductor device of claim 1, further comprising a film layer on the second surface of the interposer layer in between the interposer layer and the second die stack.

7. The semiconductor device of claim 1, further comprising molding compound encapsulating the first and second die stacks and the wire bonds.

8. The semiconductor device of claim 1, wherein the interposer layer comprises a first interposer layer, the semiconductor device further comprising:
   a second interposer layer having a first surface affixed to the fourth semiconductor die and a second surface opposite the first surface; and
   a third die stack having a fifth semiconductor die mounted adjacent the second surface of the second interposer layer.

9. The semiconductor device of claim 1, wherein the third die stack is vertically aligned over the first die stack.

10. A semiconductor device, comprising:
    a substrate;
    a first die stack having a first semiconductor die mounted to the substrate and a second semiconductor die at an end of the first die stack opposite the first semiconductor die, the first die stack offset stepped in a first direction;
    an interposer layer having first and second edges, a first set of contact pads along the first edge, a second set of contact pads along the second edge, and electrical traces connecting corresponding contact pads from the first and second sets together, the interposer layer further including first and second surfaces, the first surface affixed to the second semiconductor die;
    a second die stack having a third semiconductor die mounted adjacent the second surface of the interposer layer and a fourth semiconductor die at an end of the second die stack opposite the third semiconductor die, the second die stack offset stepped in a second direction opposite the first direction; and
    wire bonds connecting a die bond pad on the fourth semiconductor die with the substrate via a path comprising: i) die bond pads on any semiconductor die in the second stack between the third and fourth semiconductor die, ii) a die bond pad on the third semiconductor die a contact pad of the second set of contact pads on the interposer layer, iii) a contact pad of the first set of contact pads on the interposer layer and a die bond pad on the second semiconductor die, iv) die bond pads on any semiconductor die in the first stack between the first and second semiconductor die, and v) a die bond pad on the first semiconductor die and a contact pad on the substrate.

11. The semiconductor device of claim 10, wherein the first and second die stacks include flash memory die.

12. The semiconductor device of claim 10, wherein the first and second die stacks each include four to eight memory die.

13. The semiconductor device of claim 10, further comprising a film layer on the second surface of the interposer layer in between the interposer layer and the second die stack.

14. The semiconductor device of claim 10, further comprising molding compound encapsulating the first and second die stacks and the wire bonds.

15. The semiconductor device of claim 10, wherein the interposer layer comprises a first interposer layer, the semiconductor device further comprising:

a second interposer layer having a first surface affixed to the fourth semiconductor die and a second surface opposite the first surface; and a third die stack having a fifth semiconductor die mounted adjacent the second surface of the second interposer layer, wherein the third die stack is vertically aligned over the first die stack.

16. A method of forming a semiconductor device, comprising:

(a) forming a substrate;

(b) mounting a first die stack to the substrate in an offset configuration stepped in a first direction, the first die stack having a first semiconductor die adjacent the substrate and a second semiconductor die at an end of the first die stack opposite the first semiconductor die;

(c) affixing an interposer layer to the second semiconductor die, the interposer having a first surface affixed to the second semiconductor die and a second surface opposite the first surface;

(d) mounting a second die stack adjacent the interposer layer in an offset configuration stepped in a second direction opposite the first direction, the second die stack having a third semiconductor die mounted adjacent the second surface of the interposer layer and a fourth semiconductor die at an end of the second die stack opposite the third semiconductor die; and (e) wire the first and second die stacks to the substrate, comprising the step of forming a wire bond from a die bond pad of the second semiconductor die to a first contact pad on the second surface of the interposer layer in a same process that wire bonds are formed between die bond pads of the second semiconductor die and other semiconductor die in the first die stack.

17. The method of claim 16, further comprising the step of embedding the wire bond from a die bond pad of the second semiconductor die to a first contact pad on the second surface of the interposer layer in said step (e) in a film layer.

18. The method of claim 16, further comprising the step of mounting the second die stack directly to the film layer.

19. The method of claim 16, further comprising the step of wire bonding the third semiconductor die to a second contact pad on the second surface of the interposer layer.

20. The method of claim 19, further comprising the step of providing the first and second contact pads of the interposer layer at opposite edges of the interposer layer.

* * * * *